United States Patent [19]
Izumi et al.

[11] 4,181,970
[45] Jan. 1, 1980

[54] DIGITAL ATTENUATOR FOR COMPRESSED PCM SIGNALS

[75] Inventors: Kazuto Izumi; Kazuo Izumi, both of Yokohama, Japan

[73] Assignee: Nippon Telegraph and Telephone Public Corporation, Tokyo, Japan

[21] Appl. No.: 910,065

[22] Filed: May 26, 1978

Related U.S. Application Data

[63] Continuation-in-part of Ser. No. 701,574, Jul. 1, 1976, Pat. No. 4,115,785, which is a continuation of Ser. No. 507,812, Sep. 20, 1974, Pat. No. 4,004,140.

[30] Foreign Application Priority Data

Oct. 8, 1973 [JP] Japan .................. 48-113109

[51] Int. Cl.² .......................................... G06F 7/39
[52] U.S. Cl. ............................................... 364/760
[58] Field of Search ............. 364/760, 759, 757, 754

[56] References Cited

U.S. PATENT DOCUMENTS

| | | | |
|---|---|---|---|
| 3,535,498 | 10/1970 | Smith, Jr. .................. | 364/757 X |
| 3,691,359 | 9/1972 | Doll et al. .................. | 364/758 |
| 3,752,970 | 8/1973 | Aaron et al. ............... | 364/715 |
| 3,818,202 | 6/1974 | Ellison ....................... | 364/718 |
| 3,919,535 | 11/1975 | Vattvone .................... | 364/760 |
| 3,959,639 | 5/1976 | Koethmann ................ | 364/760 |

*Primary Examiner*—David H. Malzahn
*Attorney, Agent, or Firm*—Burgess, Ryan and Wayne

[57] ABSTRACT

A digital attenuator is used in a Digital Echo Suppressor to attenuate a PCM signal. This is done to decrease the influence of echo caused by both long time delay and impedance mismatching at a hybrid coil.

The digital attenuator attenuates the PCM signal which is compressed by $\mu$ Law, when an attenuation control signal generated in the digital echo suppressor is applied to the digital attenuator. It passes the PCM signal through without attenuating it when the attenuation control signal is not applied.

The attenuator consists of a plurality of pattern shift circuits and an adder or plural number of adders and a selector.

The principle of the attenuation is described hereinafter;

The attenuation quantity is attained from Eq. 1.

$$\text{Pout} = \alpha \text{ Pin} \qquad (1)$$

where
Pin = input PCM signal compressed by $\mu$ Law.
Pout = attenuated output PCM signal,
$\alpha$ = attenuation parameter which is a real number satisfying the condition $0 < \alpha < 1$, and $\alpha$ is a summation of arbitrary numbers from $\frac{1}{2}^1, \frac{1}{2}^2, \frac{1}{2}^3, \frac{1}{2}^4, \ldots, \frac{1}{2}^n$.
(n: number of shifting bits)

The feature of the digital attenuator is that attenuation characteristics vary according to input PCM signal level.

2 Claims, 7 Drawing Figures

| SEGMENT NUMBER | PCM PATTERN | | AUDIO SIGNAL LEVEL + 32 |
|---|---|---|---|
| | A B C | W X Y Z | 13 12 11 10 9 8 7 6 5 4 3 2 1 |
| 1 | 0 0 0 | W X Y Z | 0 0 0 0 0 0 0 1 W X Y Z 0 |
| 2 | 0 0 1 | W X Y Z | 0 0 0 0 0 0 1 W X Y Z 0 1 |
| 3 | 0 1 0 | W X Y Z | 0 0 0 0 0 1 W X Y Z 0 1 1 |
| 4 | 0 1 1 | W X Y Z | 0 0 0 0 1 W X Y Z 0 1 1 1 |
| 5 | 1 0 0 | W X Y Z | 0 0 0 1 W X Y Z 0 1 1 1 1 |
| 6 | 1 0 1 | W X Y Z | 0 0 1 W X Y Z 0 1 1 1 1 1 |
| 7 | 1 1 0 | W X Y Z | 0 1 W X Y Z 0 1 1 1 1 1 1 |
| 8 | 1 1 1 | W X Y Z | 1 W X Y Z 0 1 1 1 1 1 1 1 |

FIG.1

| SEGMENT NUMBER | INPUT PCM PATTERN A B C | W X Y Z | | OUTPUT PCM PATTERN A B C | W X Y Z | |
|---|---|---|---|---|---|---|
| 1 | 0 0 0 | W X Y Z | → | 0 0 0 | 0 W X Y | |
| 2 | 0 0 1 | W X Y Z | ⎤ | 0 0 0 | W X Y Z | ($W \neq 1$) |
|   |   | ADD | | | 1 0 0 0 | |
|   |   | | ⎦→ | 0 0 0 | 1 X Y Z | |
|   | 0 0 1 | 1 X Y Z | → | 0 0 1 | 0 0 X Y | |
| 3 | 0 1 0 | W X Y Z | ⎤ | 0 0 1 | W X Y Z | ($W \cdot X \neq 1$) |
|   |   | ADD | | | 1 0 0 | |
|   |   | | ⎦→ | 0 0 1 | $(W+X)\bar{X}$ Y Z | |
|   | 0 1 0 | 1 1 Y Z | → | 0 1 0 | 0 0 0 Y | |
| 4 | 0 1 1 | W X Y Z | ⎤ | 0 1 0 | W X Y Z | $W \cdot X \cdot Y \neq 1$ |
|   |   | ADD | | | 1 0 | $W'=W+X \cdot Y$ |
|   |   | | ⎦→ | 0 1 0 | $W' X' \bar{Y}$ Z | $X'=\bar{X} \cdot Y + \bar{Y} \cdot X$ |
|   | 0 1 1 | 1 1 1 Z | → | 0 1 1 | 0 0 0 0 | |
| 5 | 1 0 0 | W X Y Z | ⎤ | 0 1 1 | W X Y Z | $W \cdot X \cdot Y \cdot Z \neq 1$ |
|   |   | ADD | | | | $W^\varepsilon=W+X \cdot Y$ |
|   |   | | ⎦→ | 0 1 1 | $W^\varepsilon X^\varepsilon Y^\varepsilon \bar{Z}$ | $X^\varepsilon=X(\bar{Z}+\bar{Y})+\bar{X} \cdot Y \cdot Z$ |
|   | 1 0 0 | 1 1 1 Z | → | 0 1 1 | 0 0 0 0 | $Y=\bar{Z}Y+Z\bar{Y}$ |
| 6 | 1 0 1 | W X Y Z | → | 1 0 0 | W X Y Z | |
| 7 | 1 1 0 | W X Y·Z | → | 1 0 1 | W X Y Z | |
| 8 | 1 1 1 | W X Y Z | → | 1 1 0 | W X Y Z | |

REMARK: X·Y IS THE LOGICAL PRODUCT OF X AND Y.
X+Y IS THE LOGICAL SUM OF X AND Y.

DIGITAL ATTENUATOR FOR COMPRESSED PCM SIGNALS

This application is a continuation-in-part of co-pending application No. 701,574 filed July 1, 1976, now U.S. Pat. No. 4,115,785, said co-pending application being a continuation of prior co-pending application Ser. No. 507,812, filed Sept. 20, 1974, now U.S. Pat. No. 4,004,140.

BACKGROUND OF THE INVENTION

The present invention relates to a digital attenuator.

In telecommunication systems, such as long cable communication systems and satellite communication systems, an echo problem arises due to a long delay time between hybrid coils in which signals are changed from two-wire system to four-wire system. In order to decrease the echo, in conventional echo suppressors, an analog attenuator, having about 6 dB attenuation, is inserted into a receiving path so that echo may be attenuated by an amount corresponding to the attenuation quantity attained by this attenuator when the transmitting signal is higher than the receiving signal. In order to further improve the echo suppression effect, the analog attenuator of the type described above is combined with the analog amplitude compressor so that the echo attenuation quantity may be nearly proportional to the input audio signal level.

Upon the introduction of PCM communication systems, digital echo suppressors have been proposed which are capable of suppressing echo without modifying or converting the PCM signal to an analog signal. In general, conventional digital echo suppressors have used a digital attenuator linearly attenuated by about 6 dB, as with the case of a conventional analog attenuator.

However, conventional digital attenuators have defects in that the circuit arrangement is very complex, because complex logic operations must be carried out, and in that the attenuation quantity is constant, irrespective of the input audio signal level. Therefore, in order to obtain an attenuation quantity nearly in proportion to the input audio signal level, a conventional digital attenuator must be used in combination with a digital compressor whose function is similar to that of an analog compressor. As a result, the circuit arrangement becomes more and more complex.

The present invention relates to a digital attenuator which is inserted into the receiving path of a digital echo suppressor when the attenuation control signal is applied to the digital attenuator. Also, the present invention gives an attenuation quantity nearly in proportion to the input PCM signal level.

SUMMARY OF THE INVENTION

One of the object of this invention is, therefore, to provide a digital attenuator which may obtain an attenuation quantity nearly in proportion to the input PCM signal level when the attenuation control signal is applied to the digital attenuator, and which may pass the input PCM signal through when no attenuation control signal is applied.

Another object of this invention is to provide a simple construction digital attenuator.

Briefly stated, in order to accomplish the above and other objects of this invention, a simple selecting circuit is used, and simple logic operations are carried out by utilizing the nonlinear characteristics of the input PCM signal which is compressed by $\mu$ Law in a PCM terminal equipment, whereby an attenuation quantity may be attained nearly in proportion to the input PCM signal. When the attenuation control signal is not applied to the digital attenuator, the input PCM signal passes through from input output terminal 1 or 11 to output terminal 8 or 18 shown in FIG. 4 or FIG. 5. When no attenuation control signal is applied, output PCM signal Pout is derived from the operation of the product of $\alpha$ and Pin. More particularly, $\alpha \times$ Pin is obtained by shifting Pin to the lower digit side in a plurality of pattern shift circuits by a predetermined number of bits, which differs in each pattern shift circuit, and adding the outputs of the pattern shift circuits to each other in an adder or adders.

BRIEF DESCRIPTION OF THE DRAWINGS

FIG. 1 is a table showing the relation between PCM patterns and audio signal levels obtained by a 15 segment piecewise linear compander, FIG. 2 is a conversion table used for the conversion of input PCM patterns into output PCM patterns by a conventional digital attenuator.

DESCRIPTION OF THE PREFERRED EMBODIMENTS

Figure 3:
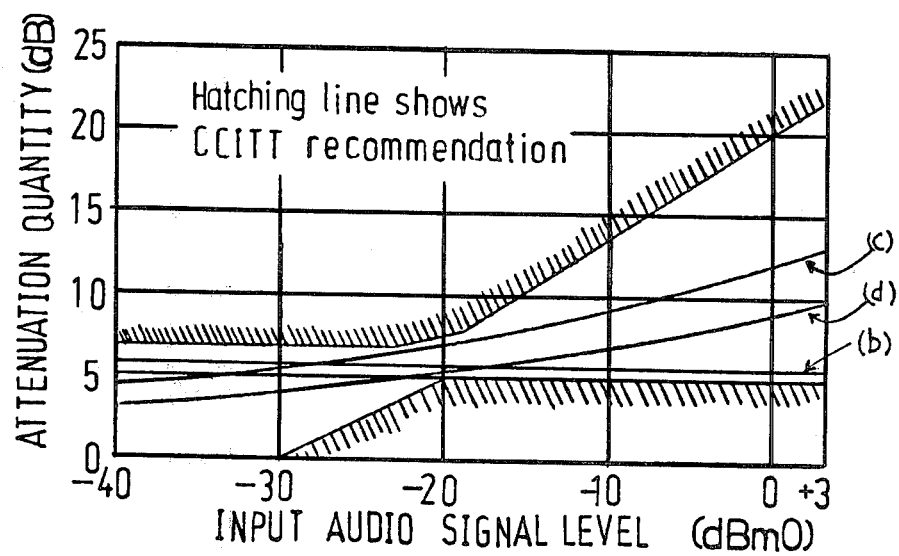
FIG. 3 is a graph illustrating the relation between input audio signal level and attenuation quantity.

FIG. 1 shows the relation between the PCM patterns and the audio signal levels in the part of the positive segments in the 15 segment piecewise linear compander recommended by CCITT (International Telegraph and Telephone Consultative Committee) and is generally used in a PCM terminal equipment. In practice, the 15 segment piecewise linear compander consists of 7 negative segments and 8 positive segments shown in FIG. 1. Positive and negative segments are symmetrical. W, X, Y and Z, shown in FIG. 1, represent 1 or 0, respectively.

FIG. 2 is a conversion table between input and output PCM patterns of a conventional digital attenuator with 6 dB attenutation, which was disclosed in the paper "6 decibel digital attenuation" by W. L. Montgomery, in Conf. Rec., 1970, IEEE Int. Conf. Communications, pp. 7-20-7-26.

Using this conversion table, several examples of conventional conversion will be described hereinafter.

1 When the input PCM pattern belongs to, for instance, segment No. 6, the output PCM pattern may be derived by merely changing the bits in columns A, B and C. For instance, when input PCM pattern is

A B C W X Y Z
(1 0 1 1 1 0 0), output PCM pattern becomes
(1 0 0 1 1 0 0)

To determine attenuation, input and output PCM patterns are converted into audio signal levels by the conversion table shown in FIG. 1. That is, the input PCM pattern
(1 0 1 1 1 0 0)

is converted into the audio signal level (0 0 1 1 1 0 0 0 1 1 1 1)−32=1791 while the output PCM pattern (1 0 0 1 1 0 0)

is converted into (0 0 0 1 1 1 0 0 0 1 1 1)−32=879

Therefore, attenuation quantity is given by 20 log(1791/879)≈6.18 dB.

2 When an input PCM pattern belongs to, for instance, segment No. 3, the conversion method is different from that of Example 1. That is, when W·X≠1, the bits in columns A, B and C must be changed to (0 0 1) and then (1 0 0) must be added. However, when W·X=1, the bits in columns A, B and C remain unchangded, while the bits in columns W, X, Y and Z must be changed, as shown in segment No. 3 in FIG. 2. For instance, when an input PCM pattern is (0 1 0 1 0 1 0).

Hence, W X=0, so that

A B C (0 1 0)

is changed to (0 0 1).

Next the addition (0 0 1 1 0 1 0)+(1 0 0)

is carried out to obtain the output PCM pattern (0 0 1 1 1 1 0).

To determine attenuation quantity, both input and output PCM patterns are converted into an audio signal level by the conversion table shown in FIG. 1.

That is, input PCM pattern (0 1 0 1 0 1 0)

is converted into (0 0 0 0 0 1 1 0 1 0 0 1 1)−32=179 while output PCM pattern (0 0 1 1 1 1 0)

is converted into (0 0 0 0 0 0 1 1 1 1 0 0 1)−32=89

Therefore, the attenuation quantity is given by 20 log(179/89)≈6.07 dB

As described above, the conventional digital attenuator may attain an attenuation quantity of about 6 dB, irrespective of the input levels, as indicated by curve (b) in FIG. 3.

As mentioned above, different operations must be executed according to the segment numbers in the conventional digital attenuator, so that the arrangement of logic circuits becomes very complex. Moreover, the attenuation quantity is constant, irrespective of the input audio signal level, so that the echo compression effect is not satisfactory in practice. Therefore, a conventional digital attenuator must be used in combination with a digital compressor or the like. At present, such combinations are not disclosed in pertinent literature, papers and patents.

In view of the above, one of the object of this invention is to provide a digital attenuator simple in construction and capable of attaining such a characteristic that the attenuation quantity is proportional to the input audio signal level.

This invention consists of a plural number of shifting circuits, an adder or plural number of adders and a selector.

The input PCM signal is attenuated in the attenuator when the attenuation control signal, which is generated in the digital echo suppressor, is applied to the digital attenuator, or the input PCM signal passes through the digital attenuator when no attenuation control signal is applied. The selector selects the attenuated PCM signal or input PCM signal to the output terminal, according to whether or not an attenuation control signal exists.

The attenuation characteristic is very different from that reported by Montgomery, in that the attenuation characteristic quantity is not constant but is proportional to the input audio signal level.

The underlying principle of this attenuator will be described hereinafter.

The attenuation output PCM signal is attained by shifting the branched input PCM signal by a predetermined number of bits in each pattern shift circuit, and adding the whole outputs of the pattern shift circuits.

That is, the relation between Pin and Pout is expressed as Eq. (2)

$$\text{Pout} = \alpha \text{Pin} \qquad (2)$$

where $\alpha$=attenuation parameter, which is a real number satisfying the condition $0<\alpha<1$, and consists of the summation of arbitrary numbers from $\frac{1}{2}^n$ (n: number of shifting bits).

That is, $\alpha$ consists of $\alpha = \frac{1}{2}^1 + \frac{1}{2}^2 = 0.75$, or $\alpha = \frac{1}{2}^1 + \frac{1}{2}^2 + \frac{1}{2}^4 = 0.8125$, or $\alpha = \frac{1}{2}^1 + \frac{1}{2}^2 + \frac{1}{2}^3 = 0.875$, or the like.

This invention will become apparent from the description of several examples described hereinafter.

A EXAMPLE 1

Calculation of the attenuation quantity.

This is an example of $\alpha = \frac{1}{2} + \frac{1}{2}^2 = 0.75$

Output signal is obtained from Eq. (1) as follows;

$$\text{Pout} = \alpha \times \text{Pin} = (\tfrac{1}{2} + \tfrac{1}{2}^2) \times \text{Pin} = (\tfrac{1}{2}^1) \times \text{Pin} + (\tfrac{1}{2}^2) \times \text{Pin} \qquad (2)$$

As attenuation varies with changes in the value of input PCM signal, it is calculated by two arbitrary input PCM patterns described hereinafter.

(1) When input PCM pattern=(1011100) in binary number.

In this case,

Output PCM
pattern=$(\tfrac{1}{2}^1 + \tfrac{1}{2}^2) \times (1011100) = (101110) + (10111) = (1000101)$ Input audio signal level Lin, corresponding to the input PCM pattern (1011100), is obtained from FIG. 1, as follows, $$\text{Lin} = (0011100011111) - 32 = 1791$$

On the contrary, output audio signal level Lout, corresponding to output PCM pattern (1000101), is obtained from FIG. 1, as follows, $$\text{Lout} = (0001010101111) - 32 = 655$$

Therefore, attenuation quantity is $$20 \log(1791/655) \approx 8.7 \text{ dB}.$$

(2) When input PCM pattern=(0101010).
In this case;

Output PCM
pattern=$(\tfrac{1}{2}^1 + \tfrac{1}{2}^2) \times (0101010) = (010101) + (01010) = (0011111)$ From FIG. 1, input audio signal level Lin, corresponding to input PCM pattern (0101010), is $$Lin = (0000011010011) - 32 = 179.$$

Output audio signal level Lout, corresponding to the output PCM pattern (0011111), is $$Lout = (0000001111101) - 32 = 93.$$

Therefore, attenuation quantity is $$20 \log(179/93) \approx 5.7 \text{ dB}.$$

Audio signal level Ld in dBm0 can be obtained from PCM pattern P, as follows,

Letting PCM pattern (ABCWXYZ) divide into two parts, such as (ABC) and (WXYZ), the following equation is obtained.

$$(ABCWXYZ) = (10000) \times (ABC) + (WXYZ) \qquad (3)$$

Let patterns (ABC) and (WXYZ) change to decimal numbers S and D, respectively, $$S: \text{decimal value of } (ABC) \qquad (4)$$

$$D: \text{decimal value of } (WXYZ) \qquad (5)$$

Using S and D, the audio signal level L is obtained by Eq. (6)

$$L = 2^{S+5} + 2^{S+1} \times D + 2^S - 1 - 32 = (33 + 2 \times D) \times 2^S - 33 \qquad (6)$$

As audio signal level L linearly corresponds to audio signal voltage V, audio signal voltage V is obtained from Eq. (7)

$$V = (V\text{max}/L\text{max}) \times L(V) \qquad (7)$$

where $$V\text{max} = \sqrt{2 \times P_0 \times Z \times \text{EXP}(3/10)} \ (V)$$

$$L\text{max} = 8031$$

which correspond to the maximum audio signal level (3 dBm0) at the PCM coder input.

$P_0$ = standard power (= 1 mW)
$Z$ = circuit impedance

Audio signal level Ld in dBm0 is obtained from Eq. (8)
That is, $$Ld = 10 \times \log(V^2/2P_0Z) = 10 \times \log[(\tfrac{1}{2}P_0Z) \times (V\text{max}/L\text{max})^2 \times L^2] = 10 \times \log L^2 - 75.10 \text{ (dBm0)} \qquad (8)$$

Therefore, the Ld value which corresponds to input PCM pattern (1011100) or (0101010) is obtained from Eq. (6) and Eq. (8) as follows;

$Ld = -10.03$ (dBm0) (when P = 1011100)
$Ld = -30.04$ (dBm0) (when P = 0101010)

Therefore, the relation between input audio signal level and attenuation quantity in the example is indicated by curve (c) in FIG. 3.

B EXAMPLE 2

Calculation of the attenuation quantity.
This is an example of $\alpha = \tfrac{1}{2}^1 + \tfrac{1}{2}^2 + \tfrac{1}{2}^4 = 0.8125$
Output PCM pattern is obtained from Eq. (1), as follows, $$P\text{out} = \alpha \times P\text{in} = (\tfrac{1}{2}^1 + \tfrac{1}{2}^2 + \tfrac{1}{2}^4) \times P\text{in} = (\tfrac{1}{2}^1) \times P\text{in} + (\tfrac{1}{2}^2) \times P\text{in} + (\tfrac{1}{2}^4) \times P\text{in} \qquad (3)$$

Attenuation quantity is calculated by the same two arbitrary input PCM patterns used above.

(1) When input PCM pattern = (1011100).
In this case,

Output PCM
pattern = $(\tfrac{1}{2}^1 + \tfrac{1}{2}^2 + \tfrac{1}{2}^4) \times (1011100) = (101110) + (10111) + (101) = (1001010)$ Output audio signal level Lout, corresponding to PCM pattern (1001010), is obtained from FIG. 1, as follows, $$Lout = (0001101001111) - 32 = 815.$$

Therefore, attenuation quantity is $$20 \log(1791/815) \approx 6.84 \text{ dB}.$$

(2) When input PCM pattern = (0101010).
In this case,

Output PCM
pattern = $(\tfrac{1}{2}^1 + \tfrac{1}{2}^2 + \tfrac{1}{2}^4) \times (0101010) = (010101) + (01010) + (010) = (0100001).$ Output audio signal level Lout, corresponding to PCM pattern (0100001), is obtained from FIG. 1, as follows, $$Lout = (0000010001011) - 32 = 107$$

Therefore, attenuation quantity is $$20 \log(179/107) \approx 4.47 \text{ dB}.$$

The relation between input audio signal level and attenuation quantity in the example is indicated by curve (d) in FIG. 3.

C FIRST EMBODIMENT OF DIGITAL ATTENUATOR

Figure 4:
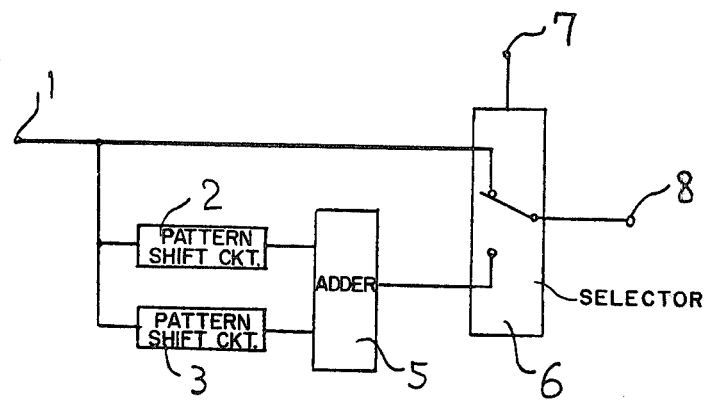
FIG. 4 is a block diagram which shows one example of the present invention.

In order to obtain the digital attenuation described hereinbefore in conjunction with Example 1, in which $\alpha = \tfrac{1}{2}^1 + \tfrac{1}{2}^2 = 0.75$, a digital attenuator of this invention shown in block diagram in FIG. 4, comprises, in general, an input terminal 1, a first pattern shift circuit 2, a second pattern shift circuit 3, an adder 5, a selector 6, an attenuation control terminal 7 and an output terminal 8.

The input PCM pattern applied to input terminal 1 is branched to both first and second pattern shift circuits 2 and 3, and the output patterns thereof, which have been shifted by one bit or two bits in each pattern shift circuit, are added in the adder 5, so that attenuated output PCM pattern is derived from adder 5.

The selector selects the input PCM signal when no attenuation control signal is applied at attenuation control terminal 7, or selects the attenuated PCM signal derived from adder 5 when an attenuation signal is applied. Therefore, the attenuated PCM signal is derived from output terminal 8 when the attenuated control signal is applied, and input PCM signal is derived from output terminal 8 when it is not applied.

Figure 6:
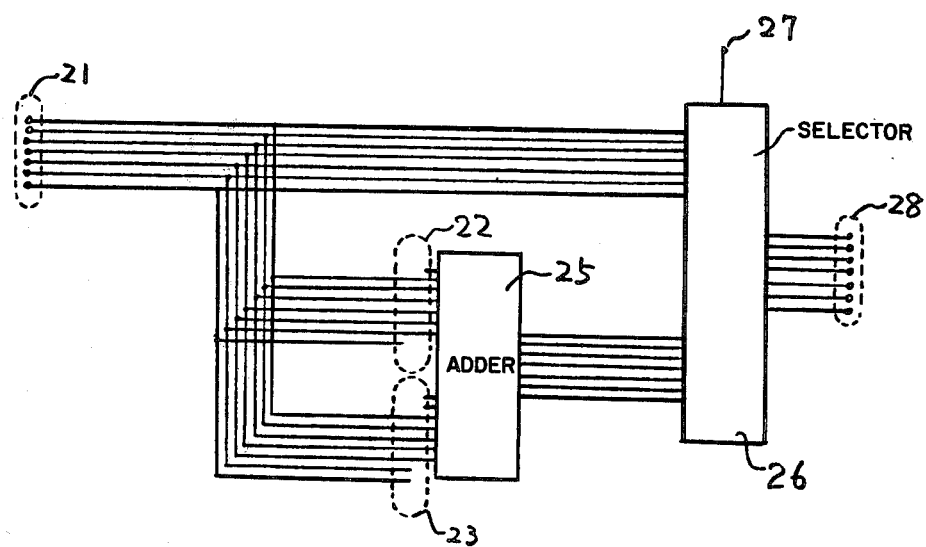
FIG. 6 is a circuit drawing which embodies the block diagram of FIG. 4

A first embodiment of the actual circuit is shown in FIG. 6, which comprises an input terminal 21, a first shift circuit 22, a second shift circuit 23, an adder 25, a selector 26, an attenuation control terminal 27, and an output terminal 28.

First shift circuit 22 in FIG. 6 is a embodiment of circuit 2 in FIG. 4, where all input bits are shifted by one bit to the LSB (the Least Significant Bit) side and, therefore, one bit from the LSB side is abandoned.

Second shift circuit 23 in FIG. 6, is the embodiment of circuit 3 in FIG. 4, where all input bits are shifted by two bits to the LSB side and, therefore, two bits from the LSB side are abandoned.

The two branched PCM signals, which are branched from the input PCM signal are shifted by one bit or two bits, respectively, are added in the adder 25. The attenuated PCM signal is derived as the output PCM signal from the adder 25.

In selector 26, the input PCM signal is selected when no attenuated control signal is applied to the terminal 27 or the attenuated PCM signal is selected when the attenuation control signal is applied to the attenuation control terminal 27. Each selected signal is derived to the output terminal 28 as the output PCM signal from the adder 26.

D SECOND EMBODIMENT OF DIGITAL ATTENUATOR

Figure 5:
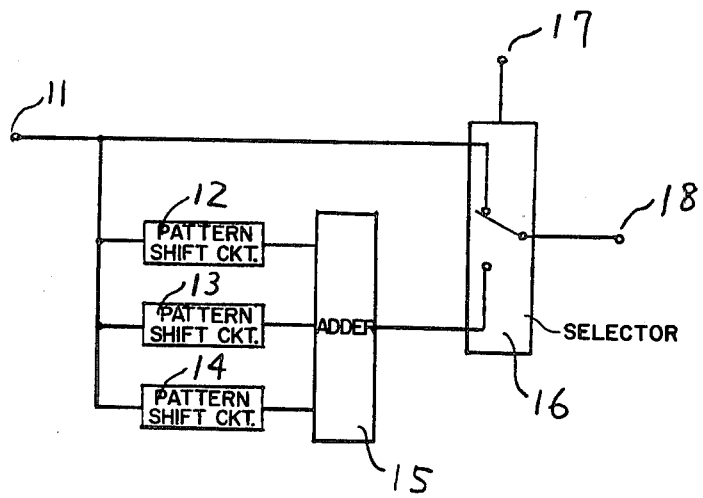
FIG. 5 is a block diagram which shows one example of the present invention.

In order to obtain the digital attenuation described hereinbefore in conjunction with Example 1, in which $\alpha = \frac{1}{2}^1 + \frac{1}{2}^2 + \frac{1}{2}^4 = 0.8125$, a digital attenuator of this invention, shown in block diagram in FIG. 5, comprises, in general, an input terminal 11, a first pattern shift circuit 12, a second pattern shift circuit 13, a third pattern shift circuit 14, an adder 15, a selector 16, an attenuation control terminal 17 and an output terminal 18.

The input PCM pattern applied to the input terminal 11 is branched to both the first, second and third pattern shift circuits 12, 13 and 14. The output patterns thereof, which have been shifted by one bit or two bits or three bits in each pattern shift circuit, are added in the adder 15, so that the attenuated output PCM pattern is derived from adder 15.

The selector selects the input PCM signal when no attenuation control signal is applied at attenuation control terminal 17, or selects the attenuated PCM signal derived from the adder 15 when an attenuation control signal is applied. Therefore, the attenuated PCM signal is derived from the output terminal 18 when the attenuated control signal is applied, and the input PCM signal is derived from the output terminal 18 when it is not applied.

Figure 7:
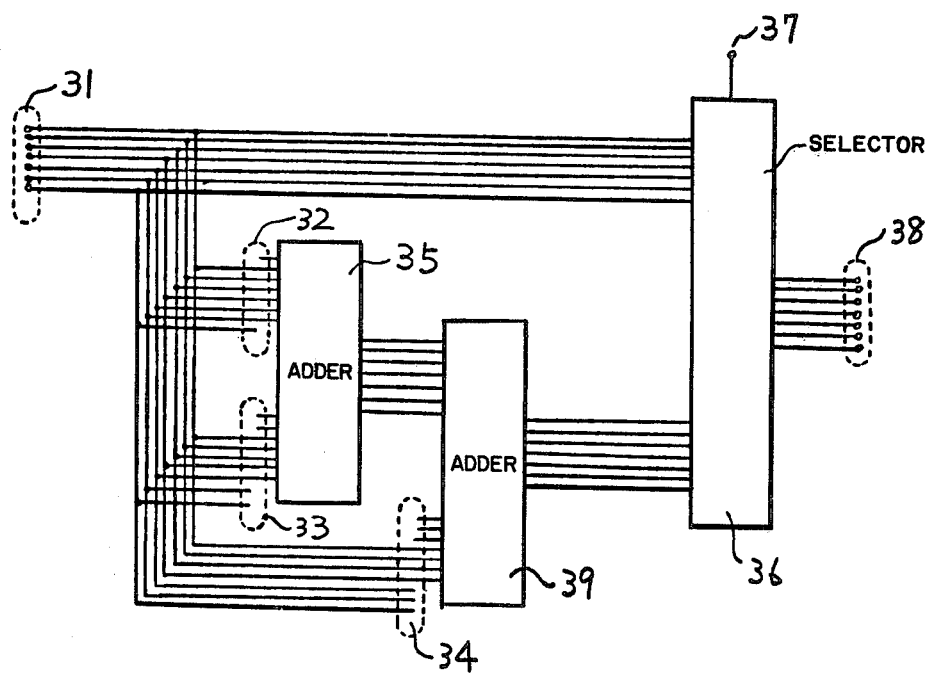
FIG. 7 is a circuit drawing which embodies the block diagram of FIG. 5.

A second embodiment of the actual circuit is shown in FIG. 7, which comprises an input terminal 31, a first shift circuit 32, a second shift circuit 33, an adder 35, a third shift circuit 34, an adder 39, a selector 36, an attenuation control terminal 37, and an output terminal 38.

The first shift circuit 32 in FIG. 7 is the embodiment of circuit 12 in FIG. 5, where all input bits are shifted by one bit to the LSB side and, therefore, one bit form the LSB side is abandoned.

The second shift circuit 33 in FIG. 7, is the embodiment of circuit 13 in FIG. 5, where all input bits are shifted by two bits to the LSB side and, therefore, two bits from the LSB side are abandoned.

Third shift circuit 34, in FIG. 7, is the embodiment of circuit 14 in FIG. 5, where all input bits are shifted by three bits to the LSB side and, therefore, three bits from side are abandoned.

The two branched input signals, which are branched from the input PCM signal and shifted by one bit or two bits, respectively, are added in the adder 35. Other branched input signals, branched from the input PCM signal, are shifted three bits and added with the output from the adder 39. The attenuated PCM signal is derived as the output PCM signal from the adder 39.

In the selector 36, the input PCM signal is selected when no attenuated control signal is applied to the attenuation control terminal 37 or the attenuated PCM signal is selected when the attenuation control signal is applied at the attenuation control terminal 37. One of the selected PCM signals is derived to the output terminal 38 as the output PCM signal from the adder 39.

What is claimed is:

1. A digital attenuator comprising:
first and second pattern shift circuits;
means for branching an input compressed PCM signal to each of said pattern shift circuits;
said first pattern shift circuit having means for shifting the branched input PCM signal to the lower side by a predetermined number of bits from one bit to five bits;
said second pattern shift circuit having means for shifting the branched input PCM signal to the lower side by a predetermined number of bits, from one bit to five bits, which differ from those in the first pattern shift circuit;
a first adder for adding the outputs from said pattern shift circuits to provide an attenuated PCM signal; and
a selector for selecting the input PCM signal when no attenuation control signal is applied to the selector, or selecting the attenuated PCM signal when an attenuation control signal is applied to the selector, as the output signal.

2. A digital attenuator comprising:
first, second and third pattern shift circuits;
means for branching an input compressed PCM signal to each of said pattern shift circuits;
said first pattern shift circuit having means for shifting the branched input PCM signal to the lower side by a predetermined number of bits, from one bit to five bits;
said second pattern shift circuit having means for shifting the branched input PCM signal to the lower side by a predetermined number of bits, from one bit to five bits, which differ from those in the first pattern shift circuit;
a first adder for adding the outputs from the first and second pattern shift circuits;
said third pattern shift circuit having means for shifting the branched input PCM signal to the lower side by a predetermined number of bits, from one bit to five bits, which differ from those in the first and second pattern shift circuits;
a second adder for adding the output of the first adder with the output from the third pattern shift circuit to provide an attenuated PCM signal; and
a selector for selecting the input PCM signal when no attenuation control signal is applied to the selector, or selecting the attenuated PCM signal when an attenuation control signal is applied to the selector, as the output signal.

* * * * *

UNITED STATES PATENT OFFICE
CERTIFICATE OF CORRECTION

Patent No. 4,181,970　　　　　　　　Dated　January 1, 1980

Inventor(s)　Kazuto Izumi, et al

It is certified that error appears in the above-identified patent and that said Letters Patent are hereby corrected as shown below:

Column 2, line 7: Change "input output terminal 1" to --input terminal 1--.

Column 3, line 15: Change "changded" to --changed--.

Signed and Sealed this

Twenty-ninth Day of July 1980

[SEAL]

Attest:

SIDNEY A. DIAMOND

Attesting Officer　　Commissioner of Patents and Trademarks